United States Patent

Barsoukov et al.

(10) Patent No.: US 8,049,465 B2
(45) Date of Patent: Nov. 1, 2011

(54) SYSTEMS, METHODS AND CIRCUITS FOR DETERMINING MICRO-SHORT

(75) Inventors: Yevgen P. Barsoukov, Richardson, TX (US); Garry Elder, Rockwall, TX (US); Jinrong Qian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 563 days.

(21) Appl. No.: 11/869,793

(22) Filed: Oct. 10, 2007

(65) Prior Publication Data

US 2009/0099799 A1   Apr. 16, 2009

(51) Int. Cl.
*H02J 7/00* (2006.01)
(52) U.S. Cl. ............ 320/132; 320/136; 324/432
(58) Field of Classification Search ............ 320/132
See application file for complete search history.

(56) References Cited

U.S. PATENT DOCUMENTS

| | | | |
|---|---|---|---|
| 5,642,031 A * | 6/1997 | Brotto | 320/156 |
| 6,789,026 B2 | 9/2004 | Barsoukov et al. | |
| 6,832,171 B2 | 12/2004 | Barsoukov et al. | |
| 2003/0146737 A1 * | 8/2003 | Kadouchi et al. | 320/132 |
| 2003/0218447 A1 * | 11/2003 | Coates et al. | 320/134 |
| 2005/0017687 A1 | 1/2005 | Nagaoka | |
| 2006/0033475 A1 * | 2/2006 | Moore | 320/132 |
| 2006/0186859 A1 | 8/2006 | Fujikawa et al. | |
| 2007/0052424 A1 | 3/2007 | Okumura | |

FOREIGN PATENT DOCUMENTS

| | | |
|---|---|---|
| JP | 2002228691 | 8/2002 |
| JP | 2002334726 | 11/2002 |
| JP | 2003178811 | 6/2003 |
| JP | 2007-046942 | 2/2007 |
| JP | 2007-071632 | 3/2007 |
| WO | 2006-022073 | 3/2006 |

OTHER PUBLICATIONS

U.S. Appl. No. 11/869,789, filed Oct. 10, 2007.
Office Action for U.S. Appl. No. 11/869,789, dated Mar. 19, 2010.

* cited by examiner

*Primary Examiner* — Arun Williams
(74) *Attorney, Agent, or Firm* — William B. Kempler; Wade J. Brady, III; Frederick J. Telecky

(57) ABSTRACT

Various systems and methods for determining micro-shorts are disclosed. For example, some embodiments of the present invention provide battery systems including a determination of potential micro-shorts based on rate of change of state of charge. Such battery systems include: a battery, a processor, and a computer readable medium. The computer readable medium includes instructions executable by the processor to: determine a rate of change of the state of charge of the battery; compare the rate of change of the state of charge of the battery against a threshold; and indicate a potential failure where the result of the comparison is beyond the threshold.

21 Claims, 5 Drawing Sheets

SYSTEMS, METHODS AND CIRCUITS FOR DETERMINING MICRO-SHORT

BACKGROUND OF THE INVENTION

The present invention is related to battery monitoring, and more particularly to systems and methods for detecting internal battery degradation.

A number of electronic devices utilize rechargeable batteries and associated charging systems. A rechargeable battery may be repeatedly charged and discharged over the course of its useful life. The process of charging and discharging is generally performed without incident other than the typical operational degradation of the battery over the course of operation. Indeed, most battery failure mechanisms operate to gradually decrease useful battery life and do not cause a safety hazard.

At times one or more mechanisms may come into play that result in the catastrophic battery failure. For example, during operation manufacturing defects or gradual structural or chemical degradation may result in the separation of small metallic particles or other conductive particles inside of a battery. These particles can cause internal short circuits that in some cases may result possible fire or explosion of the battery. Such a catastrophic battery failure may thus result not only in loss of the battery itself, but may result in considerable property damage and personal injury.

Some electronic devices employ an external protection circuit to detect increasing battery temperature or overheating. When an overheating event is detected, the battery may be disconnected from a circuit to which it is connected. This approach offers some ability to limit damage to an external circuit due to undesirable battery behavior, however, at times the overheating is a sign of an irreversible process that ultimately results in a fire or explosion regardless of any process disconnecting the battery from surrounding circuitry. Thus, while the aforementioned external circuits offer some level of protection, the possibility of fire or explosion still remains.

Thus, for at least the aforementioned reasons, there exists a need in the art for advanced systems, circuits and methods for determining potential battery failure.

BRIEF SUMMARY OF THE INVENTION

The present invention is related to battery monitoring, and more particularly to systems and methods for detecting internal battery degradation.

Various embodiments of the present invention provide battery systems including predictive failure determination capability based on rate of change of state of charge. Such battery systems include: a battery, a processor, and a computer readable medium. The computer readable medium includes instructions executable by the processor to: determine a rate of change of the state of charge of the battery; compare the rate of change of the state of charge of the battery against a threshold; and indicate a potential failure where the result of the comparison is beyond the threshold. In some instances of the aforementioned embodiments, the battery is a single cell battery. In such instances, the computer readable medium may further include instructions executable by the processor to adjust the rate of change of the state of charge of the battery to compensate for external current. As used herein, the phrase "computer readable medium" is used in its broadest sense to mean any medium that may contain information accessible to a computer or processor. Thus, a computer readable medium may be, but is not limited to, a random access memory, a non-volatile memory, a magnetic storage medium, an optical storage medium or the like. Based on the disclosure provided herein, one of ordinary skill in the art will recognize a variety of computer readable media that may be utilized in accordance with different embodiments of the present invention.

In other instances of the aforementioned embodiments, the battery is a multi-cell battery with at least a first cell and a second cell. In such instances, determining the rate of change of the state of charge of the battery may include determining the rate of change of the state of charge of the first cell and determining the rate of change of the state of charge of the second cell, and the computer readable medium may further include instructions executable by the processor to: determine a difference between the rate of change of the state of charge of the first cell and the rate of change of the state of charge of the second cell. In particular instances, comparing the rate of change of the state of charge of the battery against a threshold includes comparing the difference between the rate of change of the state of charge of the first cell and the rate of change of the state of charge of the second cell with the threshold.

In various instances of the aforementioned embodiments, the computer readable medium further includes instructions executable by the processor to: determine whether the battery is relaxed; and determine the state of charge of the battery. In some such instances, the battery is a multi-cell battery having at least a first cell and a second cell, and in the methods determining the state of charge of the battery includes determining the state of charge of the first cell and determining the state of charge of the second cell.

Various other embodiments of the present invention provide methods for predicting battery failure. Such methods include providing a battery; determining a rate of change of the state of charge of the battery; comparing the rate of change of the state of charge of the battery against a threshold; and determining a potential failure condition based on a result of the comparison of the rate of change of the state of charge of the battery with the threshold. In some instances of the aforementioned embodiments, the battery is a single cell battery. In such instances, the methods further include adjusting the rate of change of the state of charge of the battery to compensate for external current.

In other instances of the aforementioned embodiments, the battery is a multi-cell battery having at least a first cell and a second cell. In such instances, determining the rate of change of the state of charge of the battery includes determining the rate of change of the state of charge of the first cell and determining the rate of change of the state of charge of the second cell, and the methods further include determining a difference between the rate of change of the state of charge of the first cell and the rate of change of the state of charge of the second cell. In particular instances, comparing the rate of change of the state of charge of the battery against a threshold includes comparing the difference between the rate of change of the state of charge of the first cell and the rate of change of the state of charge of the second cell with the threshold.

In other instances of the aforementioned embodiments, the methods further include: determining whether the battery is relaxed; and determining the state of charge of the battery, wherein the state of charge of the battery is used to determine the rate of change of the state of charge of the battery. In some such instances, the battery is a multi-cell battery with at least a first cell and a second cell. In such instances, determining the state of charge of the battery includes determining the state of charge of the first cell and determining the state of charge of the second cell. The methods may further include normalizing the state of charge of the first cell and the state of charge of the second cell to a known state. In such cases, determining the rate of change of the state of charge of the battery includes determining the rate of change of the state of charge of the first cell using the normalized state of charge of the first cell, and determining the rate of change of the state of charge of the second cell using the normalized state of charge of the second cell. Such methods may further include determining a difference between the rate of change of the state of charge of the first cell and the rate of change of the state of charge of the second cell. Comparing the rate of change of the state of charge of the battery against a threshold may include comparing the difference between the rate of change of the state of charge of the first cell and the rate of change of the state of charge of the second cell with the threshold.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to battery monitoring, and more particularly to systems and methods for detecting internal battery degradation.

It has been determined that detachment of a structural element of a battery cell (e.g., metallic foil current collector, separator, or particle of active material) may result in micro-shorts, and a corresponding measurable change in voltage and state of charge (SOC) or depth of discharge (DOD). As micro-shorts in some instances are a pre-cursor to an eventual macro-short, disabling a battery upon detection of a micro-short may reduce the possibility that a macro-short develops causing a safety hazard.

Particular embodiments of the present invention operate to detect an abnormal capacity change in a particular battery or battery cell, or to detect a capacity imbalance between battery cells of the same battery. SOC for each battery cell may be detected during low-load periods by using a table correlating between open circuit voltage (OCV) and SOC, and using measured voltage (corrected for IR drop) to find SOC values at several periods of time. Comparing multiple SOC values during discharge of the battery may be used to determine whether an expected discharge rate is ongoing, or whether the discharge rate is abnormal. Where the discharge rate is abnormal, a potential battery failure may be flagged.

In various cases, the SOC values are utilized to calculate a rate of change of discharge dSOC/dt for each individual battery cell of a battery. Knowing total capacity of each individual battery cell allows for calculation of discharge current using the following formula:

$$i_{discharge} = dQ/dt,$$

where Q is charge. This discharge current can be corrected by subtracting the current flowing through external circuit. The remaining internal current ($i_{internal}$) is the current due to self discharge of the battery. Internal current can be converted back into $dSOC_{internal}/dt$ (i.e., the rate of change of SOC after compensation for external load current). This rate of change value is a cell size independent value indicating the internal discharge rate. If either the internal current or $dSOC_{internal}/dT$ exceeds predefined threshold, there is a strong indication of an existing micro-short. In such a case, the battery may be disabled by disconnecting from an external circuit or charging circuit. In the case of a smart battery, corresponding bits can be set to indicate permanent failure due to micro-shorts. Conditions present when the event happened can be saved into flash memory if available for further analysis by quality control.

Figure 1:
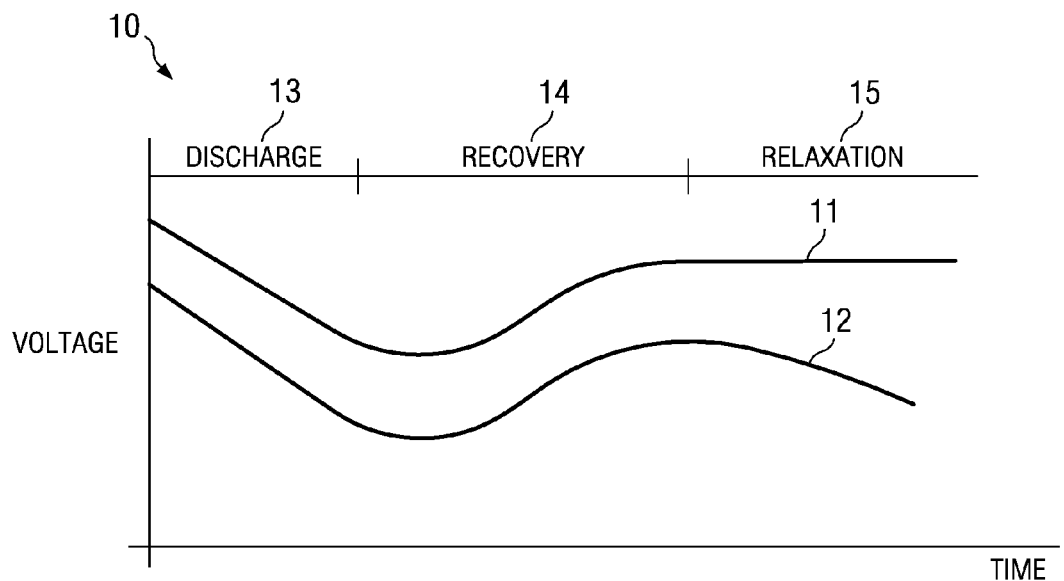
FIGS. 1-3 graphically depict changes in voltage, differential state of charge, and rate of change of state of charge that may be used in relation to different embodiments of the present invention detect potential hazards.

Turning to FIG. 1, a graph 10 depicts voltage over time for a healthy battery cell 11 during discharge, and that of a battery cell 12 plagued by internal micro-shorts for different periods of operation. Each of cells 11, 12 are shown during a discharge period 13, a period of no-discharge or relaxation 15, and a recovery period 14. As shown, the rate of discharge of healthy battery cell 11 may be considerably different from that of battery cell 12 exhibiting micro-shorts during the relaxation period due to excessive internal discharge.

Some embodiments of the present invention compare the rate of change of voltage during relaxation period 15 against a threshold to determine whether micro-shorts may be present as suggested by the following equations:

$$dV/dt_{cell\ 11} <= threshold\ (indicating\ normal\ operation);$$

$$dV/dt_{cell\ 12} <= threshold\ (indicating\ normal\ operation);$$

$$dV/dt_{cell\ 11} > threshold\ (indicating\ abnormal\ operation);\ and$$

$$dV/dt_{cell\ 12} > threshold\ (indicating\ abnormal\ operation).$$

In some embodiments, the threshold may be programmable. Where abnormal operation is indicated in either of battery cell 11 or battery cell 12, a micro-short may be present. In such a case, the battery system may be removed and discarded to avoid any potential safety hazard. It should be noted that the aforementioned approach does not compensate for external current (i.e., current applied to a load), and thus may not be as sensitive as other approaches disclosed herein. Further, the period where use of dV/dt to identify potential micro-shorts is limited, hence, some embodiments of the present invention perform various measurements and establish dV/dt for the various cells during relaxation period 15.

Other embodiments of the present invention operate to detect a relative increase of dV/dt between cells to determine whether one of the cells exhibits a micro-short and should be discarded. In particular, an absolute value of the difference between a rate of change of voltage for battery cell 11 a rate of change of voltage for battery cell 12 may be compared with a programmable threshold in accordance with the following equations:

$|dV/dt_{cell\ 11} - dV/dt_{cell\ 12}| <= \text{threshold (indicating normal operation); and}$ $|dV/dt_{cell\ 11} - dV/dt_{cell\ 12}| > \text{threshold (indicating abnormal operation).}$ Where abnormal operation is indicated, a micro-short may be present. In such a case, the battery system may be removed and discarded to avoid any potential safety hazard. It should be noted that by comparing the rate of change between battery cells external current is compensated. However, it should also be noted that as voltage is affected by SOC, more accurate results may be achieved where the test is accomplished in a fully charged state for a battery including the compared battery cells connected in series. This fully charged state may be mathematically calculated based on voltage measurements and SOC calculations done on each individual battery cell in a partially discharged state. Further, as discussed above, the period where use of dV/dt to identify potential micro-shorts is limited, hence, some embodiments of the present invention perform various measurements and establish dV/dt for the various cells during relaxation period 15.

Various embodiments of the present invention rely on calculating the state of charge (SOC) of a particular battery. This may include calculation of SOC for each battery cell of a multi-cell battery. SOC of a battery is sometimes used to indicate how much available charge remains in the battery. The present depth of discharge (DOD) of battery is related to the SOC by the equation DOD=1−SOC, and is usually utilized to obtain a computation of the remaining runtime of a device powered by the battery. As one example, SOC may be calculated similar to that discussed in U.S. Pat. No. 6,789,026 entitled "Circuit and Method for Monitoring Battery State of Charge", and filed by Barsoukov et al. on May 2, 2003. The entirety of the aforementioned US Patent is incorporated herein by reference for all purposes. Among other things, the aforementioned reference describes various exemplary approaches for determining the rate of change of the state of charge of the battery by correlating measured voltage with state-of-charge using a pre-defined correlation function.

Figure 2:
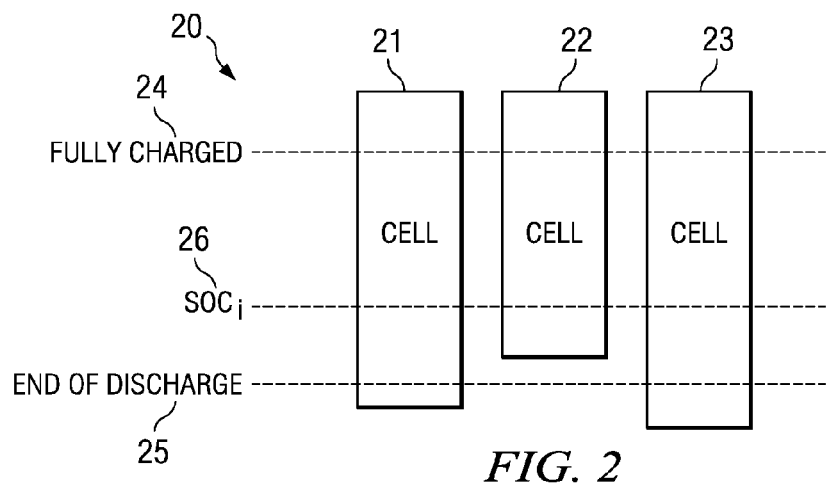

Turning to FIG. 2, a chart 20 depicts the SOC (i.e., rectangles represent the capacity of a cell, with the larger rectangle representing a larger charge capacity) for three different battery cells 21, 22, 23. As shown, each of battery cells 21, 22, 23 offers a different SOC at a corresponding point between a fully charged situation (i.e., an upper charge limit of a battery including battery cells 21, 22, 23 in series), and an end of discharge (EOD) situation (i.e., a lower charge limit of a battery including battery cells 21, 22, 23 in series). For example, at a point $SOC_i$, the SOC of battery cell 21 may be 25%, the SOC of battery cell 22 may be 10%, and the SOC of battery cell 23 may be 33%. The difference in SOC at the chosen point may be due to manufacturing or environmental variances, however, a substantial difference in SOC may indicate the presence of micro-shorts in one or more of battery cells 21, 22, 23.

Various embodiments of the present invention operate to detect a relative decrease of SOC between cells to determine whether one of the cells exhibits a micro-short and should be discarded. In particular, an absolute value of the difference between an SOC of cell 21 and SOC of cell 22 is compared with a threshold, the difference between an SOC of cell 21 and SOC of cell 23 is compared with the same threshold, and the difference between an SOC of cell 22 and SOC of cell 23 is compared with the same threshold as set forth in the following equations:

$|SOC_{cell21} - SOC_{cell22}| <= \text{threshold (indicating normal operation);}$ $|SOC_{cell21} - SOC_{cell23}| <= \text{threshold (indicating normal operation);}$ $|SOC_{cell22} - SOC_{cell23}| <= \text{threshold (indicating normal operation);}$ $|SOC_{cell21} - SOC_{cell22}| > \text{threshold (indicating abnormal operation);}$ $|SOC_{cell21} - SOC_{cell23}| > \text{threshold (indicating abnormal operation); and}$ $|SOC_{cell22} - SOC_{cell23}| > \text{threshold (indicating abnormal operation).}$ Where abnormal operation is indicated, a micro-short may be present. In such a case, the battery system may be removed and discarded to avoid any potential safety hazard. It should be noted that by comparing the SOC between battery cells external current is compensated. More accurate results are achievable where the comparison is performed using SOC values for each individual cell that have been normalized to some common point. In one particular embodiments of the present invention, SOC is normalized to the fully charged state 24 of the overall combination of battery cells 21, 22, 23. SOC at this fully charged state may be mathematically calculated (i.e., normalized) based on voltage measurements and SOC calculations done on each individual battery cell in a partially discharged state (e.g., $SOC_i$ 26).

Figure 3:
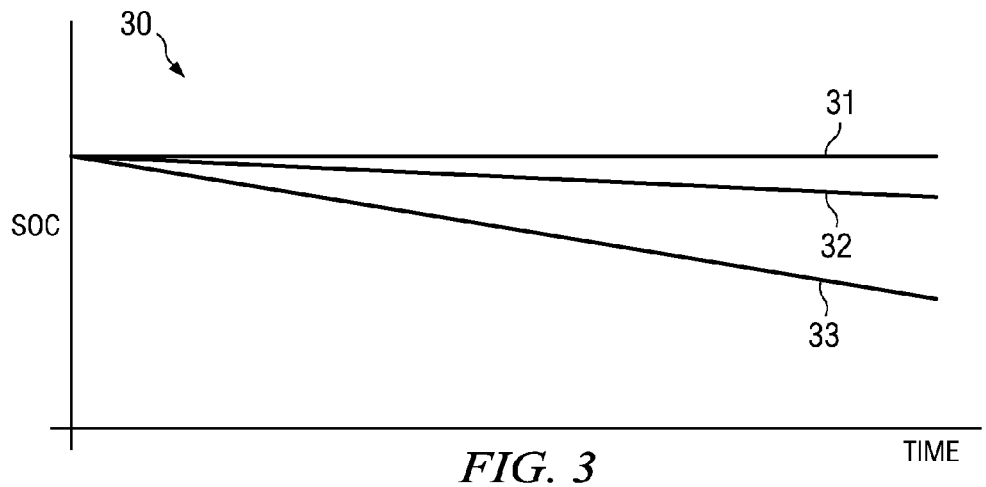

Turning to FIG. 3, a graph 30 depicts the rate of change of SOC for an ideal battery cell 31, a normal battery cell 32, and a battery cell exhibiting micro-shorts 33. As shown, the SOC of ideal battery cell 31 does not decrease when in relaxed condition as there would not be any internal discharge. As there is typically some level of internal discharge, ideal battery cell 931 is simply shown for reference. In contrast, normal battery cell 32 will have some internal discharge that causes a gradual decrease in SOC even in a relaxed condition. In further contrast, battery cell exhibiting micro-shorts 33 will have a more substantial internal discharge resulting in a more significant rate of change of SOC.

Various other embodiments of the present invention compare the rate of change of SOC against a programmable threshold according to the following equations:

$dSOC/dt <= \text{threshold (indicating normal operation); and}$ $dSOC/dt > \text{threshold (indicating abnormal operation).}$ This approach may be applied to a single cell of a multi-cell battery or to a single cell battery. To perform the comparison, it may be necessary to compensate for any external current in determining the rate of change of SOC. Where abnormal operation is indicated, a micro-short may be present. In such a case, the battery system may be removed and discarded to avoid any potential safety hazard.

Yet other embodiments of the present invention compare the difference in the rate of change of SOC of two battery cells and a programmable threshold according to the following equations:

$$|(dSOC/dt)_{cell32}-(dSOC/dt)_{cell33}| <= \text{threshold (indicating normal operation); and}$$

$$|(dSOC/dt)_{cell32}-(dSOC/dt)_{cell33}| > \text{threshold (indicating abnormal operation).}$$

In this embodiment, a comparison across two or more of multiple cells is performed. As each of the cells is impacted by external current and the comparison process effectively eliminates the effect of the external current, the aforementioned approach may be used without performing any external current compensation. Again, a micro-short may be present where abnormal operation is indicated. In such a case, the battery system may be removed and discarded to avoid any potential safety hazard.

Figure 4:
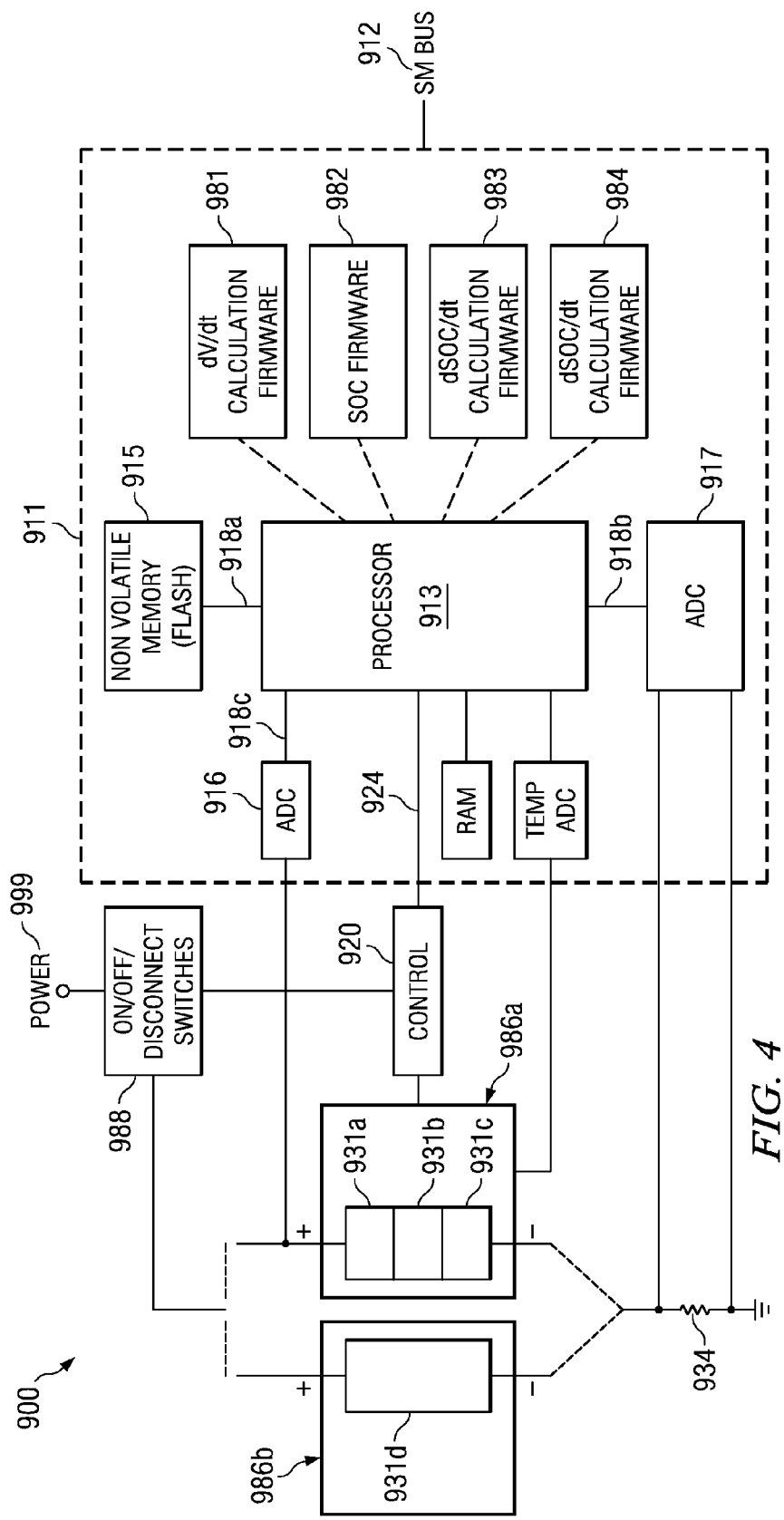
FIG. 4 is a block diagram of a battery system in accordance with one or more embodiments of the present invention.

Turning to FIG. 4, a block diagram of a battery system 900 is depicted in accordance with one or more embodiments of the present invention. Battery system 900 includes a multi-cell battery 986a, a Status and Predictive Calculation circuit 911, and a control circuit 920. In some embodiments of the present invention, all of multi-cell battery 986a, Status and Predictive Calculation circuit 911, and control circuit 920 are integrated together into a single package and generically referred to herein as a battery pack. As shown, multi-cell battery 986a includes a number of individual battery cells 931 that may be either connected in parallel or series depending upon the particular design of multi-cell battery 986a. In one particular implementation of the present invention, battery cells 931 are Lithium-ion battery cells connected in series.

In a typical implementation, each of battery cells 931 is generally equivalent, but may differ to some degree. In particular, individual battery cells 931 may exhibit differences in SOC between the cells. These differences may be due to differences introduced in the manufacturing processes used to create the cells, or due to different temperatures at which individual cells 931 are operated. Such SOC imbalance can cause voltage on some of the cells to go to unsafe range during a charging process, and this can potentially cause explosion. In addition, charge imbalance may also be due to one or more internal micro-shorts causing a relatively fast self-discharge. Such micro-shorts may be caused, for example, by small conductive particles that have broken off and are floating freely inside of a battery cell 931. These particles can cause an internal short circuit followed by possible fire or explosion of the cell.

Status and Predictive Calculation circuit 911 includes an embedded processor 913 coupled by a bidirectional data bus 918 to, among other things, a nonvolatile memory 915, an integrating analog-to-digital converter (ADC) 917, and an ADC 916. Nonvolatile memory 915 may be, but is not limited to, a conventional flash memory. ADC 916 and ADC 917 may be, for example, conventional analog to digital converters as are known in the art. Based on the disclosure provided herein, one of ordinary skill in the art will recognize a variety of analog to digital converters that may be used in relation to different embodiments of the present invention. Embedded processor 913 may be, but is not limited to, a commercially available 8 MHz processor having an 8-bit central processing unit (CPU) and a RISC architecture. Various suitable embedded processors that are commercially available can be utilized. For example, the Assignee's MSP430 microprocessor is capable of performing the necessary computations, or an embedded processor such as the one used in the Assignee's BQ8012 fuel gauge chip can be used.

Status and Predictive Calculation circuit 911 may be coupled to a standard SMBus (smart bus) 912. Through SMBus 912, Status and Predictive Calculation circuit 911 may communicate with another processor (not shown) in accordance with a suitable communications protocol. A conventional interface circuit (not shown) may be coupled between SMBus 912 and data bus 918. ADC 916 converts the cell voltage to a digital equivalent that can be accessed via data bus 918 by embedded processor 913.

The total voltage across multi-cell battery 986a (e.g., the voltage across one of cells 931 multiplied by the number of cells 931 when the cells are connected in series) is applied to an input of voltage regulator 122. A sense resistor 934 is coupled between ground and the negative terminal of multi-cell battery 986a. In one particular embodiment of the present invention, sense resistor 934 is a one hundred milli-Ohm resistor. The voltage across sense resistor 934 is applied as an input to integrating ADC 917, which converts the voltage across sense resistor 934 to a digital representation of the battery current (I) flowing through sense resistor 934. The positive terminal of multi-cell battery 986a is connected to an ON/OFF/Disconnect switch 938 that switches a power output 999.

Various information may be sent from Status and Predictive Calculation circuit 911 via a data bus 924 to control circuit 920 in order to set various levels and to transmit various safety/control information to control circuit 920. For example, a signal may be sent from Status and Predictive Calculation circuit 911 to control circuit 920 that causes ON/OFF/Disconnect switch 938 to turn on and off at desired times.

Embedded processor 913 is operable to execute firmware instructions that when executed cause Status and Predictive Calculation circuit 911 to calculate the SOC of multi-cell battery 986a and/or individual battery cells 931, to calculate the rate of voltage change of battery cells 931, and/or to calculate the rate of change of SOC for individual battery cells 931. Further, Status and Predictive Calculation circuit 911 uses the aforementioned calculations to predictively determine the potential for failure of multi-cell battery 986a.

In some embodiments of the present invention, dV/dt firmware 981 is executed by embedded processor 913. Executing dV/dt firmware 981 causes the voltage of multi-cell battery 986a to be repeatedly measured when multi-cell battery 986a is relaxed. The repeated measurements are combined to determine the rate of change of voltage (dV/dt) of multi-cell battery 986a. State prediction firmware 984 uses the calculated values of dV/dt to determine whether potential micro-shorts have developed. In particular, state prediction firmware 984 implements the following equations:

$$dV/dt_{multi-cell\ battery} <= \text{threshold (indicating normal operation); and}$$

$$dV/dt_{multi-cell\ battery} > \text{threshold (indicating abnormal operation).}$$

Where abnormal operation is indicated, a micro-short may be present. In such a case, battery system 900 may be removed and discarded to avoid any potential safety hazard. In various embodiments of the present invention, execution of dV/dt firmware 981 results in measurement of voltages from each individual battery cell 931 and calculation of dV/dt for each individual battery cell. In such a case, execution of state prediction firmware 984 causes a determination of micro-shorts using the aforementioned equations on an individual cell basis. Where abnormal behavior is identified in relation to any individual battery cell 931, a micro-short may be indicated and battery system 900 may be removed and discarded to avoid any potential safety hazard. In some other embodiments, execution of state prediction firmware 984 causes a comparison of dV/dt between battery cells 931 using the following equations:

$$|dV/dt_{cell\ 931a} - dV/dt_{cell\ 931b}| \leq \text{threshold (indicating normal operation);}$$

$$|dV/dt_{cell\ 931a} - dV/dt_{cell\ 931c}| \leq \text{threshold (indicating normal operation);}$$

$$|dV/dt_{cell\ 931b} - dV/dt_{cell\ 931c}| \leq \text{threshold (indicating normal operation);}$$

$$|dV/dt_{cell\ 931a} - dV/dt_{cell\ 931b}| > \text{threshold (indicating abnormal operation);}$$

$$|dV/dt_{cell\ 931a} - dV/dt_{cell\ 931c}| > \text{threshold (indicating abnormal operation); and}$$

$$|dV/dt_{cell\ 931b} - dV/dt_{cell\ 931c}| > \text{threshold (indicating abnormal operation).}$$

Again, where abnormal operation is indicated, a micro-short may be present. In such a case, battery system 900 may be removed and discarded to avoid any potential safety hazard.

In some embodiments of the present invention state of charge firmware 982 is executed by embedded processor 913. In particular, state of charge firmware 982 is executed by embedded processor 913 causing a measurement of the voltage or other determination of the voltage across an individual battery cell 931, or where battery cells are connected in series a measurement of the voltage or other determination of the voltage across two or more of battery cells 931 may occur followed by division by the number of battery cells 931 to achieve an average battery cell voltage. The relationship of the resulting average cell voltage to the SOC (or DOD) of the entire battery will be the same as the relationship of a single cell open-circuit voltage to the SOC (or DOD) of the battery. The foregoing relationship is generally defined by a look-up table (which will be different for batteries having different chemistries) that represents the curve of the open circuit battery voltage (OCV) verses SOC or DOD.

In particular embodiments of the present invention, execution of state of charge firmware 982 causes an OCV of multi-cell battery 986a to be measured or determined during a passive phase (i.e., when the battery powered device is off) at a time immediately prior to the time at which the battery-powered device is turned on and the battery is in a relaxed condition. Alternatively, the battery can be operatively coupled to a charger instead of to the battery-powered device, and the no-load to voltage measurement is made either prior to the beginning of charging or after termination of the charging and the passing of a suitably long relaxation period. After a suitable OCV measurement or determination is obtained, embedded processor 913 refers to a suitable look-up table to convert the OCV to a present accurate SOC or DOD value for multi-cell battery 986a or an individual battery cell 931 therein. Subsequently, the charging current or discharging current is integrated and the SOC is incremented using the resulting knowledge of the amount of total passed charge and the total charge of multi-cell battery 986a or one more individual battery cells 931 therein. In some cases, to increase the accuracy of SOC and DOD, the OCV is measured when multi-cell battery 986a is fully relaxed. In some cases, state of charge firmware 982 additionally calculates a rate of change of SOC for multi-cell battery 986a and/or for individual battery cells 931 of multi-cell battery 986a.

State prediction firmware 984 uses the calculated values of SOC to determine whether potential micro-shorts have developed. To make the comparison more accurate, SOC for each of battery cells 931 is normalized to a point corresponding to a defined fully charged state of multi-cell battery 986a. In particular, state prediction firmware 984 implements the following equations:

$$|SOC_{cell\ 931a} - SOC_{cell\ 931b}|_{Fully\ Charged\ State} \leq \text{threshold (indicating normal operation);}$$

$$|SOC_{cell\ 931a} - SOC_{cell\ 931c}|_{Fully\ Charged\ State} \leq \text{threshold (indicating normal operation);}$$

$$|SOC_{cell\ 931b} - SOC_{cell\ 931c}|_{Fully\ Charged\ State} \leq \text{threshold (indicating normal operation);}$$

$$|SOC_{cell\ 931a} - SOC_{cell\ 931b}|_{Fully\ Charged\ State} > \text{threshold (indicating abnormal operation);}$$

$$|SOC_{cell\ 931a} - SOC_{cell\ 931c}|_{Fully\ Charged\ state} > \text{threshold (indicating abnormal operation); and}$$

$$|SOC_{cell\ 931b} - SOC_{cell\ 931c}|_{Fully\ Charged\ state} > \text{threshold (indicating abnormal operation).}$$

Where abnormal operation is indicated, a micro-short may be present. In such a case, battery system 900 may be removed and discarded to avoid any potential safety hazard.

In yet further embodiments of the present invention, multiple values of SOC are created for multi-cell battery 986a. Using the multiple values of SOC, dSOC/dt firmware 983 calculates the rate of change of SOC for multi-cell battery 986a. Using the rate of change of SOC, state prediction firmware 984 determines whether potential micro-shorts have developed. In particular, state prediction firmware 984 implements the following equations:

$$(dSOC/dt)_{multi\text{-}cell\ battery} \leq \text{threshold (indicating normal operation); and}$$

$$(dSOC/dt)_{multi\text{-}cell\ battery} > \text{threshold (indicating abnormal operation).}$$

Where abnormal operation is indicated, a micro-short may be present. In such a case, battery system 900 may be removed and discarded to avoid any potential safety hazard.

In other embodiments of the present invention the difference in the rate of change of SOC of two battery cells 931 are compared with a programmable threshold according to the following equations:

$$|(dSOC/dt)_{cell\ 931a} - (dSOC/dt)_{cell\ 931b}| \leq \text{threshold (indicating normal operation);}$$

$$|(dSOC/dt)_{cell\ 931a} - (dSOC/dt)_{cell\ 931c}| \leq \text{threshold (indicating normal operation);}$$

$$|(dSOC/dt)_{cell\ 931b} - (dSOC/dt)_{cell\ 931c}| \leq \text{threshold (indicating normal operation);}$$

$$|(dSOC/dt)_{cell\ 931a} - (dSOC/dt)_{cell\ 931b}| > \text{threshold (indicating abnormal operation);}$$

$$|(dSOC/dt)_{cell\ 931a} - (dSOC/dt)_{cell\ 931c}| > \text{threshold (indicating abnormal operation); and}$$

$$|(dSOC/dt)_{cell\ 931b} - (dSOC/dt)_{cell\ 931c}| > \text{threshold (indicating abnormal operation).}$$

Again, a micro-short may be present where abnormal operation is indicated. In such a case, battery system 900 may be removed and discarded to avoid any potential safety hazard.

It should be noted that while FIG. 4 shows a particular embodiment using multi-cell battery 986a, other embodiments of the present invention may use single cell battery 986b. In such cases, one or more external current compensated schemes (e.g., schemes not involving a cell to cell comparison) as discussed above may be used. For example, a current compensated dSOC/dt may be calculated for a single cell 931d of single cell battery 986b, and that dSOC/dt compared against a threshold window to determine potential problems.

Figure 5:
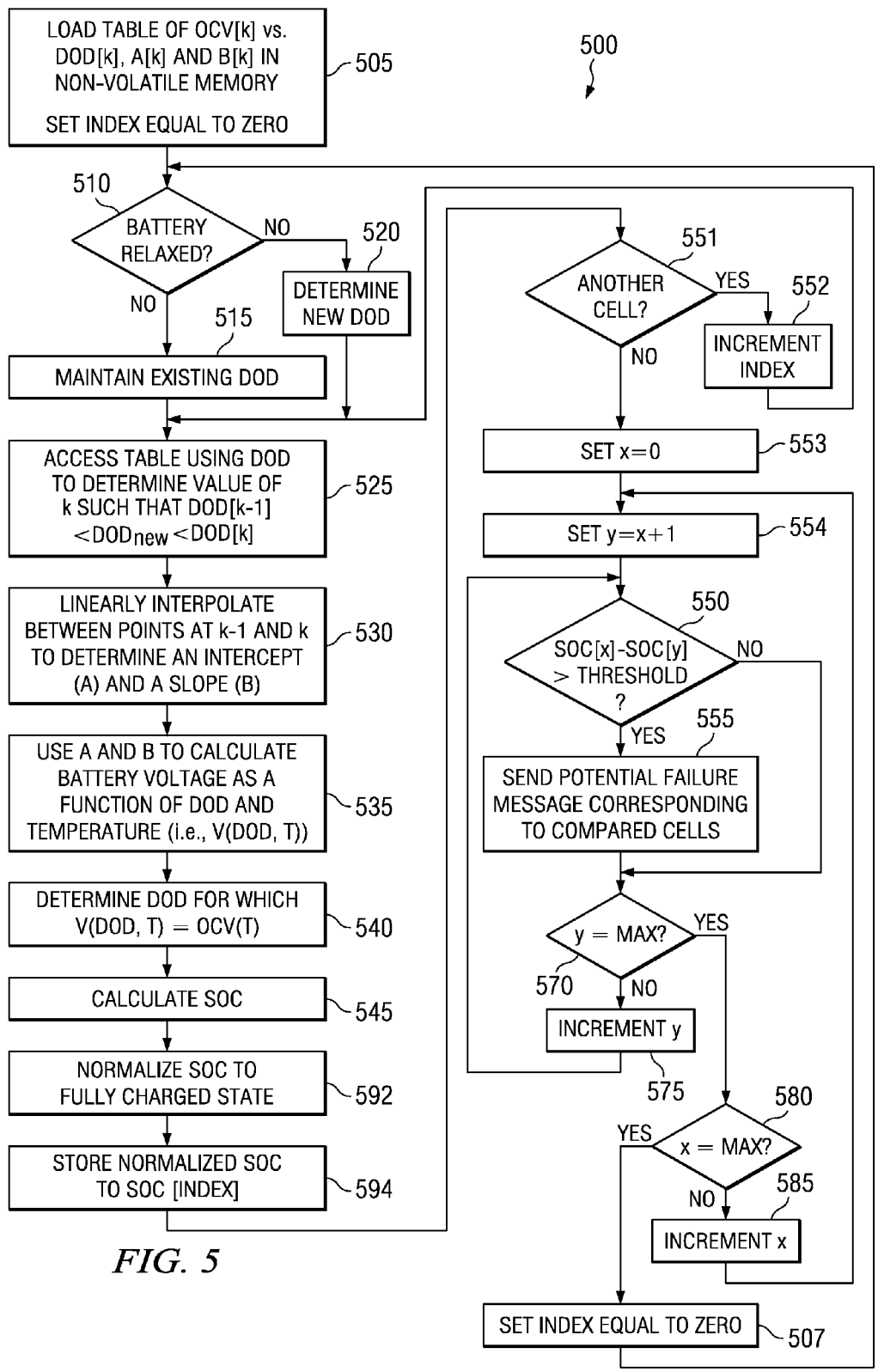
FIG. 5 is a flow diagram depicting a method in accordance with some embodiments of the present invention for detecting potential battery failures through comparison of state of charge between battery cells.

Turning to FIG. 5, a flow diagram 500 depicts a method in accordance with some embodiments of the present invention for detecting potential battery failures through comparison of normalized SOC between battery cells. Following flow diagram 500, a table of battery characteristics are loaded into non-volatile memory 915 and an Index counter is reset to zero (block 505). This table includes values of DOD, intercept (A) and slope (B) correlated to OCV for different index points k expected during a discharge of the battery for which the table is developed. This uploading may be done using any approach known in the art for writing information to a memory. The index counts individual cells to be tested within a given multi-cell battery. In this case, the first cell is identified as $cell_0$, and the last cell is identified as $cell_{n-1}$, where n is the total number of cells within the multi-cell battery.

It is then determined whether the battery is relaxed (block 510). Typically, the battery will be relaxed when it has not been driving a load for a prescribed amount of time. Where the battery is not relaxed (e.g., a load is being driven) (block 510), an existing DOD is maintained (block 515). In contrast, where the battery is relaxed (block 510), OCV is measured and a new DOD is determined based on that OCV (block 520). Using the aforementioned DOD (blocks 515, 520), a search of the loaded table is performed using a conventional database search algorithm to find a value of the index "k" so that the particular DOD satisfies the expression:

$$DOD[k-1] < DODnew < DOD[k].$$

(block 525). Once a value of k satisfying the aforementioned expression is found, an intercept A(DOD) and slope B(DOD) can be found (block 530) by linear interpolation between the index points k−1 and k using the following equations:

$$A(DOD)=(A_{k-1}*DOD_k-DOD_{k-1}*A_k)/(DOD_k-DOD_{k-1}) + DOD*(A_k-A_{k-1})/(DOD_k-DOD_{k-1});$$

and $$B(DOD)=(B_{k-1}*DOD_k-DOD_{k-1}*B_k)/(DOD_k-DOD_{k-1}) + DOD*(B_k-B_{k-1})/(DOD_k-DOD_{k-1})$$

It should be noted that the above mentioned table search is performed to yield the index value of k from which the values of A[k], A[k−1], B[k], B[k−1], DOD[k] and DOD[k−1] can be accessed from non-volatile memory 915. Such a search may be performed using various known table search algorithms, such as bi-section table search algorithms. The calculated values for A(DOD) and B(DOD) can be thought of as coefficients for determining the temperature dependence of V(DOD,T), or as the intercepts and slopes which define the straight line equation. Thus, using the calculated values of A(DOD) and B(DOD) can be used to calculate (block 535) the voltage of the battery as a function of DOD and Temperature (i.e., V(DOD, T)) according to the following equation:

$$V(DOD, T)=A(DOD)+B(DOD)*T.$$

The term V(DOD,T) above provides the battery voltage as a function of the interpolated DOD and the temperature T of the battery at the time when the corresponding OCV was measured.

Next, a value of DOD for which V(DOD,T) equals OCV (T) is determined using a conventional root-finding algorithm (block 540). The root-finding algorithm may use a maximum possible root value of one and a minimum possible root value of zero to bracket the value of the root to be determined in order to simplify the root-finding process. The root-finding process to be performed by the root-finding algorithm can be mathematically expressed by:

$$DOD=root[V(DOD,T)-OCV, DOD, 1, 0],$$

which indicates that the root, or value of DOD, which causes V(DOD,T)−OCV to be equal to 0 is iteratively determined according to the root-finding algorithm, within the boundaries 0 and 1. SOC is then calculated from DOD according to the following equation:

$$SOC=1-DOD$$

(block 545). The calculated SOC may then be normalized to a particular point, such as, for example, a fully charged state of multi-cell battery 986a (block 592). The normalized SOC is then stored to SOC[Index] (block 594), where 'Index' identifies the particular battery cell 931 within multi-cell battery 986a to which the calculated SOC is associated.

It is then determined whether the Index is equal to the total number of battery cells 931 within multi-cell battery 986a (block 551). Where it is not equal (block 551), Index is incremented (block 552) and the processes of blocks 525 through 555 are repeated for the next one of the battery cells indicated by Index.

Once Index is equal to the maximum number of battery cells 931 (block 551), a normalized SOC value will have been created for each of battery cells 931. These normalized values of SOC may then be compared with each other to determine if the differences between cell SOCs. A substantial difference in the normalized values of SOC between battery cells may indicate a potential failure ongoing in one of the compared cells.

Following flow diagram 500, two comparison counters are used, x and y, and each are initialized with x equal to zero and y equal to x+1 (blocks 553, 554). With this done, the difference between SOC[x] and SOC[y] is compared against a programmable threshold value (block 550). Where the difference exceeds the threshold (block 450), a potential failure message is sent (block 555). It is then determined whether the counter value y equals the total number of battery cells 931 within multi-cell battery 986a less one (block 570). Where y does not equal the maximum (block 570), y is incremented (block 575) and the process of comparing the difference between SOC[x] and SOC[y] against the programmable threshold value and error reporting is repeated for the new value of y (blocks 550-570).

Alternatively, where the value of y is equal to the maximum (block 570), it is determined whether x equals the total number of battery cells 931 within multi-cell battery 986a less two (block 580). Where x does not equal the maximum (block 580), x is incremented (block 585), y is set to x+1 (block 554), and the process of comparing the difference between SOC[x] and SOC[y] against the programmable threshold value and error reporting is repeated for the new value of y (blocks 550-570). This process continues until both x and y equal their respective maximums. At this point, all of the possible combinations of normalized SOC values have been compared and the process of flow diagram is restarted by setting Index to zero (block 507) and repeating the process of determining a rate of change of internal impedance for each of battery cells 931, and comparing those results to determine whether there is some indication of a potential error in multi-cell battery 986a. It should be noted that the approach set forth in blocks 553 through blocks 585 is exemplary of various processes for comparing the rate of impedance change across battery cells, and that based on the disclosure provided herein, one of ordinary skill in the art will recognize a variety of different approaches that may be utilized to perform the various comparisons in accordance with different embodiments of the present invention.

A recipient device (not shown) may receive one or more messages indicating differences between battery cells 931. In some cases, where multiple messages would be sent, they are reduced to a single message provided to the recipient device. In various cases, the recipient device applies some level of filtering to the received messages to assure that a single message does not indicate a false positive indication of potential battery failure. Where the recipient device decides that an error message rises to the level of seriousness that warrants intervention, the recipient device may disable multi-cell battery 986a by disconnecting it from any charging or discharging circuitry connected to multi-cell battery 986a. A message may then be displayed to a user that encourages the user to remove multi-cell battery 986a and to safely discharge the battery.

Figure 6:
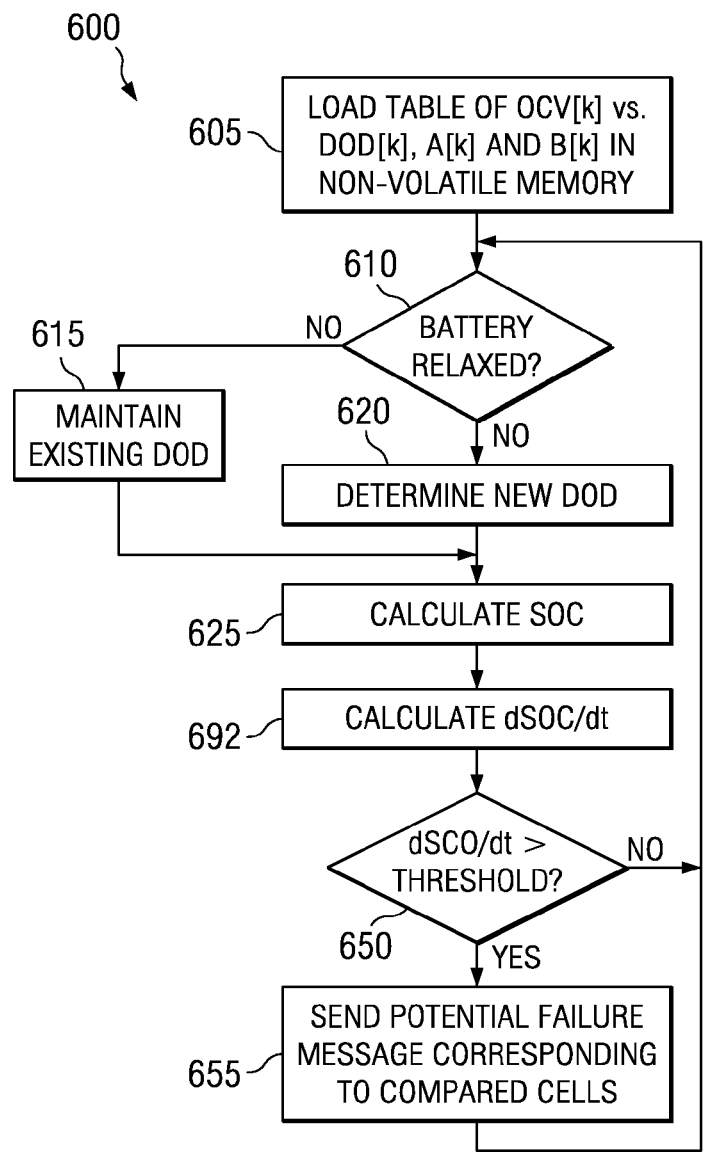
FIG. 6 is a flow diagram depicting a method in accordance with other embodiments of the present invention for detecting potential battery failure through comparison of the rate of change state of charge against a programmable threshold.

Turning to FIG. 6, a flow diagram 600 depicts a method in accordance with some embodiments of the present invention for detecting potential battery failures through comparison of dSOC/dt against a programmable threshold. Following flow diagram 600, a table of battery characteristics are loaded into non-volatile memory 915 (block 605). This table includes values of DOD, intercept (A) and slope (B) correlated to OCV for different index points k expected during a discharge of the battery for which the table is developed. Again, this uploading may be done using any approach known in the art for writing information to a memory.

It is then determined whether the battery is relaxed (block 610). Typically, the battery will be relaxed when it has not been driving a load for a prescribed amount of time. Where the battery is not relaxed (e.g., a load is being driven) (block 610), an existing DOD is maintained (block 615). In contrast, where the battery is relaxed (block 610), OCV is measured and a new DOD is determined based on that OCV (block 620). Based on either the existing DOD or new DOD (blocks 615, 620), SOC is calculated (block 625). This may be done using the processes discussed in relation to blocks 525-545 of flow diagram 400. Based on the calculated SOC values (block 625), dSOC/dt is calculated for the battery (block 692). The calculated dSOC/dt is compared against a programmable threshold (block 650). Where the value of dSOC/dt exceeds the threshold (block 650), a potential failure message is sent (block 655). Otherwise, no potential error is indicated.

Again, a recipient device (not shown) may receive one or more messages indicating differences between battery cells 931. In some cases, where multiple messages would be sent, they are reduced to a single message provided to the recipient device. In various cases, the recipient device applies some level of filtering to the received messages to assure that a single message does not indicate a false positive indication of potential battery failure. Where the recipient device decides that an error message rises to the level of seriousness that warrants intervention, the recipient device may disable multi-cell battery 986a by disconnecting it from any charging or discharging circuitry connected to multi-cell battery 986a. A message may then be displayed to a user that encourages the user to remove multi-cell battery 986a and to safely discharge the battery.

Figure 7:
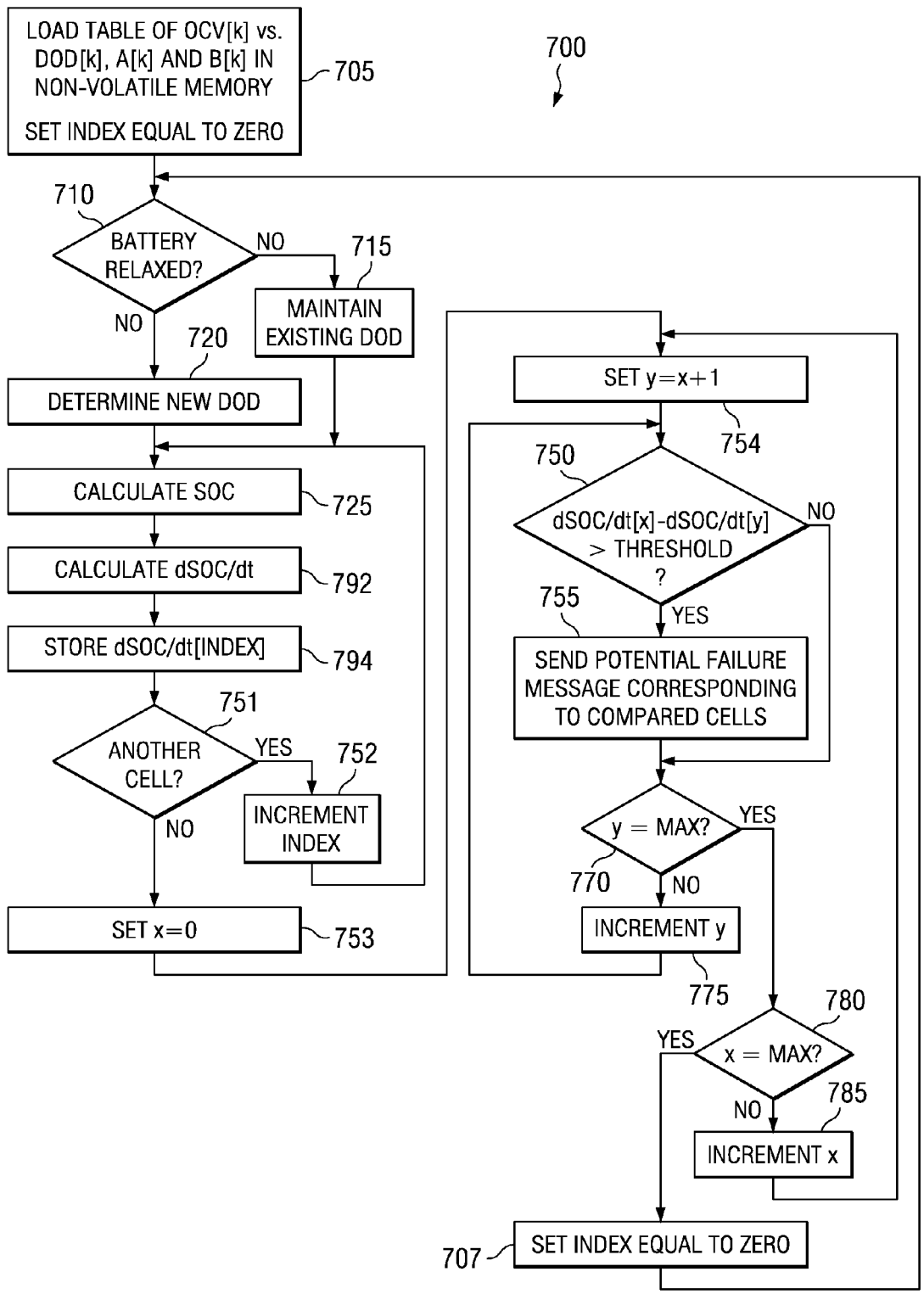
FIG. 7 is a flow diagram depicting a method in accordance with some embodiments of the present invention for detecting potential battery failures through comparison of a rate of change of state of charge between battery cells.

Turning to FIG. 7, a flow diagram 700 depicts a method in accordance with some embodiments of the present invention for detecting potential battery failures through comparison of the rate of change of SOC between battery cells. Following flow diagram 700, a table of battery characteristics are loaded into non-volatile memory 915 and an index counter is reset to zero (block 705). This table includes values of DOD, intercept (A) and slope (B) correlated to OCV for different index points k expected during a discharge of the battery for which the table is developed. This uploading may be done using any approach known in the art for writing information to a memory. The index counts individual cells to be tested within a given multi-cell battery. In this case, the first cell is identified as $cell_0$, and the last cell is identified as $cell_{n-1}$, where n is the total number of cells within the multi-cell battery.

It is then determined whether the battery is relaxed (block 710). Typically, the battery will be relaxed when it has not been driving a load for a prescribed amount of time. Where the battery is not relaxed (e.g., a load is being driven) (block 710), an existing DOD is maintained (block 715). In contrast, where the battery is relaxed (block 710), OCV is measured and a new DOD is determined based on that OCV (block 720). Based on either the existing DOD or new DOD (blocks 715, 720), SOC is calculated (block 725). Again, calculation of SOC may be done using the processes discussed in relation to blocks 525-545 of flow diagram 400. Based on the calculated SOC values (block 725), dSOC/dt is calculated for the particular battery cell (block 792), and the calculated dSOC/dt value is stored to dSOC/dt[Index] (block 794).

It is then determined whether the Index is equal to the total number of battery cells 931 within multi-cell battery 986a (block 751). Where it is not equal (block 751), Index is incremented (block 752) and the processes of blocks 725, 792 and 794 are repeated for the next one of the battery cells indicated by Index. Once Index is equal to the maximum number of battery cells 931 (block 751), a dSOC/dt value will have been created for each of battery cells 931. These values of dSOC/dt may then be compared with each other to determine if the differences between cell dSOC/dt. A substantial difference in the values of dSOC/dt between battery cells may indicate a potential failure ongoing in one of the compared cells.

Following flow diagram 700, two comparison counters are used, x and y, and each are initialized with x equal to zero and y equal to x+1 (blocks 753, 754). With this done, the difference between dSOC/dt[x] and dSOC/dt[y] is compared against a programmable threshold value (block 750). Where the difference exceeds the threshold (block 750), a potential failure message is sent (block 755). It is then determined whether the counter value y equals the total number of battery cells 931 within multi-cell battery 986a less one (block 770). Where y does not equal the maximum (block 770), y is incremented (block 775) and the process of comparing the difference between dSOC/dt[x] and dSOC/dt[y] against the programmable threshold value and error reporting is repeated for the new value of y (blocks 750-770).

Alternatively, where the value of y is equal to the maximum (block 770), it is determined whether x equals the total number of battery cells 931 within multi-cell battery 986a less two (block 780). Where x does not equal the maximum (block 780), x is incremented (block 785), y is set to x+1 (block 754), and the process of comparing the difference between dSOC/dt[x] and dSOC/dt[y] against the programmable threshold value and error reporting is repeated for the new value of y (blocks 750-770). This process continues until both x and y equal their respective maximums. At this point, all of the possible combinations of dSOC/dt values have been compared and the process of flow diagram is restarted by setting Index to zero (block 707) and repeating the process of determining a rate of change of internal impedance for each of battery cells 931, and comparing those results to determine whether there is some indication of a potential error in multi-cell battery 986a. It should be noted that the approach set forth in blocks 753 through blocks 785 is exemplary of various processes for comparing the rate of impedance change across battery cells, and that based on the disclosure provided herein, one of ordinary skill in the art will recognize a variety of different approaches that may be utilized to perform the various comparisons in accordance with different embodiments of the present invention.

Again, a recipient device (not shown) may receive one or more messages indicating differences between battery cells 931. In some cases, where multiple messages would be sent, they are reduced to a single message provided to the recipient device. In various cases, the recipient device applies some level of filtering to the received messages to assure that a single message does not indicate a false positive indication of potential battery failure. Where the recipient device decides that an error message rises to the level of seriousness that warrants intervention, the recipient device may disable multi-cell battery 986a by disconnecting it from any charging or discharging circuitry connected to multi-cell battery 986a. A message may then be displayed to a user that encourages the user to remove multi-cell battery 986a and to safely discharge the battery.

Figure 8:
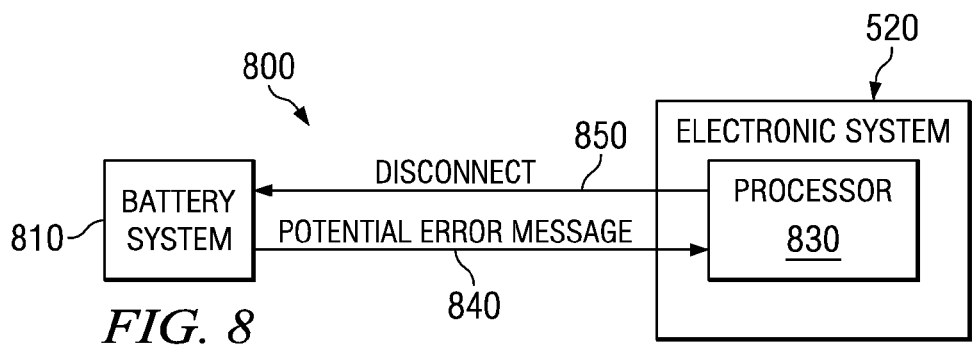
FIG. 8 shows a battery powered electronic system in accordance with different embodiments of the present invention.

Turning to FIG. 8, a battery powered electronic system 800 is depicted in accordance with different embodiments of the present invention. As shown, battery powered electronic system 800 includes a battery system 810 and some operating electronic system 820 (i.e., a recipient system) including a processor 830. It should be noted that operating electronic system 820 may be any electronic system including, but not limited to, a cellular telephone, a laptop computer, a game device, an audio player, or a video player. Based on the disclosure provided herein, one of ordinary skill in the art will recognize a variety of electronic systems that may be used in relation to different embodiments of the present invention. Battery system 810 may be any battery capable of providing a potential error message 840, and for receiving and acting on a request to disconnect 850. Thus, battery system 900 may be used in place of battery 810. In operation, when a potential error message 840 is received by processor 830, processor 830 may make one or more analysis to determine whether the message is a false positive. Where the error is not a false positive, processor 830 may send a disconnect signal 850 causing battery 810 to be disconnected from any charging circuit and from electronic system 820. Further battery 810 may be subjected to any process deemed helpful to rendering battery 810 safe.

In conclusion, the present invention provides novel systems, devices, methods for detecting potential battery failure. While detailed descriptions of one or more embodiments of the invention have been given above, various alternatives, modifications, and equivalents will be apparent to those skilled in the art without varying from the spirit of the invention. For example, various embodiments of the present invention are described in relation to a multi-cell battery, but it should be noted that various of the approaches discussed herein may be readily applied to a single cell battery. Therefore, the above description should not be taken as limiting the scope of the invention, which is defined by the appended claims.

What is claimed is:

1. A method for predicting battery failure, the method comprising:
   providing a battery comprising at least one cell;
   determining a time rate of change of a state of charge of the cell during a period of no activity of a connected external load;
   comparing the time rate of change of the state of charge of the cell against a threshold; and
   determining a potential failure condition based on a value of self-discharge providing an indication of micro-shorts within the battery as a result of the comparison of the time rate of change of the state of charge of the cell with the threshold.

2. The method of claim 1, wherein the battery is a single cell battery, and wherein the method further comprises:
   adjusting the time rate of change of the state of charge of the battery to compensate for external load current.

3. The method of claim 1, wherein the battery is a multi-cell battery having at least a first cell and a second cell, wherein determining the time rate of change of the state of charge of the battery includes determining the time rate of change of the state of charge of the first cell and determining the time rate of change of the state of charge of the second cell, and wherein the method further comprises: determining a difference between the time rate of change of the state of charge of the first cell and the time rate of change of the state of charge of the second cell.

4. The method of claim 3, wherein comparing the time rate of change of the state of charge of the battery against a threshold includes comparing the difference between the time rate of change of the state of charge of the first cell and the time rate of change of the state of charge of the second cell with the threshold.

5. The method of claim 1, wherein the method further comprises:
   determining whether the battery is relaxed; and
   determining the state of charge of the battery, wherein the state of charge of the battery is used to determine the time rate of change of the state of charge of the battery.

6. The method of claim 5, wherein the battery is a multi-cell battery, wherein the multi-cell battery includes at least a first cell and a second cell, wherein determining the state of charge of the battery includes determining the state of charge of the first cell and determining the state of charge of the second cell, and wherein the method further comprises:
   calculating a normalized state of charge of the first cell to a known state; and
   calculating a normalized state of charge of the second cell to the known state.

7. The method of claim 6, wherein determining the time rate of change of the state of charge of the battery includes determining the time rate of change of the state of charge of the first cell using the normalized state of charge of the first cell, and determining the time rate of change of the state of charge of the second cell using the normalized state of charge of the second cell, and wherein the method further comprises:
   determining a difference between the time rate of change of the state of charge of the first cell and the time rate of change of the state of charge of the second cell; and
   wherein comparing the time rate of change of the state of charge of the battery against a threshold includes comparing the difference between the time rate of change of the state of charge of the first cell and the time rate of change of the state of charge of the second cell with the threshold.

8. The method of claim 1, wherein determining the time rate of change of the state of charge of the battery is done by correlating measured voltage with state-of-charge using a pre-defined correlation function.

9. A battery system including predictive failure determination capability based on time rate of change of state of charge, wherein the battery system comprises:
- a battery comprising at least one cell;
- a processor; and
- a computer readable medium, wherein the computer readable medium includes instructions executable by the processor to:
  - determine a time rate of change of the state of charge of the cell during a period of no activity of a connected external load;
  - compare the time rate of change of the state of charge of the cell against a threshold; and
  - indicate a potential failure based on a value of self-discharge providing an indication of micro-shorts within the battery where the result of the comparison is beyond the threshold.

10. The battery system of claim 9, wherein the battery is a single cell battery.

11. The battery system of claim 10, wherein the computer readable medium further includes instructions executable by the processor to adjust the time rate of change of the state of charge of the battery to compensate for external load current.

12. The battery system of claim 9, wherein the battery is a multi-cell battery, and wherein the multi-cell battery includes at least a first cell and a second cell.

13. The battery system of claim 12, wherein determining the time rate of change of the state of charge of the battery includes determining the time rate of change of the state of charge of the first cell and determining the time rate of change of the state of charge of the second cell, and wherein the computer readable medium further includes instructions executable by the processor to:
- determine a difference between the time rate of change of the state of charge of the first cell and the time rate of change of the state of charge of the second cell.

14. The battery system of claim 13, wherein comparing the time rate of change of the state of charge of the battery against a threshold includes comparing the difference between the time rate of change of the state of charge of the first cell and the time rate of change of the state of charge of the second cell with the threshold.

15. The battery system of claim 9, wherein the computer readable medium further includes instructions executable by the processor to:
- determine whether the battery is relaxed; and
- determine the state of charge of the cell, wherein the state of charge of the cell is used to determine the time rate of change of the state of charge of the cell.

16. The battery system of claim 15, wherein the battery is a multi-cell battery, wherein the multi-cell battery includes at least a first cell and a second cell, and wherein determining the state of charge of the battery includes determining the state of charge of the first cell and determining the state of charge of the second cell.

17. The battery system of claim 16, wherein the computer readable medium further includes instructions executable by the processor to:
- calculating a normalized state of charge of the first cell to a known state; and
- calculating a normalized state of charge of the second cell to the known state.

18. The battery system of claim 17, wherein determining the time rate of change of the state of charge of the battery includes determining the time rate of change of the state of charge of the first cell using the normalized state of charge of the first cell, and determining the time rate of change of the state of charge of the second cell using the normalized state of charge of the second cell.

19. The battery system of claim 18, wherein the computer readable medium further includes instructions executable by the processor to:
- determine a difference between the time rate of change of the state of charge of the first cell and the time rate of change of the state of charge of the second cell.

20. The battery system of claim 19, wherein comparing the time rate of change of the state of charge of the battery against a threshold includes comparing the difference between the time rate of change of the state of charge of the first cell and the time rate of change of the state of charge of the second cell with the threshold.

21. An electronic system, wherein the electronic system comprises:
- a battery powered electronic circuit, wherein the battery powered electronic circuit includes a device processor; and
- a battery system, wherein the battery system powers the electronic circuitry, and wherein the battery system includes:
  - a battery comprising at least one cell;
  - a processor; and
  - a computer readable medium, wherein the computer readable medium includes instructions executable by the processor to:
    - determine a time rate of change of the state of charge of the cell during a period of no activity of a connected external load;
    - compare the time rate of change of the state of charge of the cell against a threshold; and
    - indicate a potential failure based on a value of self-discharge providing an indication of micro-shorts within the battery where the result of the comparison is beyond the threshold.

* * * * *